United States Patent [19]

Coldren

[11] B 3,982,113

[45] Sept. 21, 1976

[54] ACOUSTOELECTRIC WAVE SEMICONDUCTOR SIGNAL PROCESSING APPARATUS WITH STORAGE OF WEIGHTING FACTOR

[75] Inventor: Larry Allen Coldren, Leonardo, N.J.

[73] Assignee: Bell Telephone Laboratories, Incorporated, Murray Hill, N.J.

[22] Filed: Nov. 5, 1974

[21] Appl. No.: 520,924

[44] Published under the second Trial Voluntary Protest Program on January 27, 1976 as document No. B 520,924.

[52] U.S. Cl. ................................ 235/181; 235/197; 333/30 R; 333/72

[51] Int. Cl.[2] ........................ G06G 7/19; H03H 9/24

[58] Field of Search ............. 235/181, 197; 333/30, 333/72; 178/7.1

[56] References Cited

UNITED STATES PATENTS

| | | | |
|---|---|---|---|
| 3,816,753 | 6/1974 | Kino | 235/181 |
| 3,826,865 | 7/1974 | Quate et al. | 178/7.1 |
| 3,826,866 | 7/1974 | Quate et al. | 178/7.1 |
| 3,833,867 | 9/1974 | Solie | 235/181 |
| 3,851,280 | 11/1974 | Staples | 333/72 |

OTHER PUBLICATIONS

Khuri-Yakub et al: Anomolithic Zinc-Oxyde-on-Silicon Convolver, Applied Physics Letters Vol. 25 No. 4, Aug. 15, 1974.

Kino et al: Signal Processing by Parametric Interactions IEEE Transact. on Sonics and Ultrasonics, Vol. SU 20 No. 2 Apr. 1973.

Hayakawa et al.: Storage of Acoustic Signals in Surface States in Silicon, Appl. Physics Letters Vol. 25 No. 4 Aug. 15, 1974.

Stern et al.: New Adaptive Signal Processing Concept, Electronics Letters Mar. 7, 1974 Vol. 10 No. 5.

Coldren: Zinc-Oxide-on-Silicon Acoustically Scanned Imager with Positive Sensitivity Storage Capabilities, Applied Physics Letters Vol. 27 No. 1, July 1, 1975, pp. 6–8.

*Primary Examiner*—Felix D. Gruber
*Attorney, Agent, or Firm*—D. I. Caplan

[57] ABSTRACT

A pair of radio frequency (RF) input acoustic surface waves, of acoustic frequencies $f_1$ and $f_2$ traveling in opposite ($\pm z$) directions, mutually nonlinearly interact acoustoelectronically along a layered structure of semiconductor-dielectric-electrode in which the dielectric layer includes a piezoelectric film. The dielectric layer advantageously contains a predetermined spatially varying pattern of trapped electrical charges, in accordance with a desired information storage pattern, along the $z$ direction. The envelope of the RF voltage response across the structure is a functional representation (memory scan, convolution, correlation, or transform) of the information storage pattern, the type of functional relationship depending upon the envelopes of the RF input acoustic waves. In particular, if one RF input is a very narrow pulse while the other RF input is a continuous signal, then the output signal directly represents as a function of time the spatially varying pattern of trapped electrical charges (memory scan).

11 Claims, 4 Drawing Figures

ACOUSTOELECTRIC WAVE SEMICONDUCTOR SIGNAL PROCESSING APPARATUS WITH STORAGE OF WEIGHTING FACTOR

FIELD OF THE INVENTION

This invention relates to the field of semiconductor apparatus, and more particularly to semiconductor devices for signal processing.

BACKGROUND OF THE INVENTION

In the semiconductor art, many signal processing functions can be performed by an array of semiconductor device elements, typically transistors, arranged in appropriate circuit configurations. However, for certain desired functions, the arrays of required semiconductor elements can become quite complicated, particularly as to the number of required semiconductor elements and the complexity of interconnections. Consequently, manufacturing yields, costs, and reliability can become important considerations which motivate a search for more functional type of semiconductor devices, that is, devices which are more monolithic in construction from the standpoint of reduction in the number and complexity of the required device elements and interconnections.

An example of a more functional type of semiconductor device is a monolithic semiconductor acoustoelectric wave convolver, that is, a device which can perform signal processing involving the nonlinear mixing of a pair of acoustic waves propagating in opposite directions along a piezoelectric medium adjacent to a semiconductor medium. The acoustic waves in the piezoelectric medium interact with each other by virtue of their mutual corresponding electronic waves excited in the semiconductor medium, with consequent electronic coupling in the semiconductor medium of these acoustoelectric waves.

An important subclass of wave convolvers is a weighted wave convolver in which the input waves are coupled in the medium in accordance with a weighting function $W(z)$, that is, the strength of the coupling interaction varies with position in the medium along the propagation direction. Such a weighted wave convolver is useful in such applications as memory scan, that is, the generation of an output signal which varies in time just as a stored memory pattern varies in space. In addition, weighted wave convolvers are useful for such signal processing applications as Fourier transformation as well as matched filters, that is, filters in which the output is appreciable only if an input signal profile is similar to a predetermined signal profile. Such convolver devices are particularly useful if the weighting function $W(z)$ can be relatively permanently stored in the device itself in a monolithic type structure. It would therefore be advantageous to have a monolithic weighted wave convolver type structure for convolving signals with a prescribed weighting function $W(z)$ which can be substantially permanently stored in the structure.

SUMMARY OF THE INVENTION

A signal convolver is formed on a major xz plane surface of a semiconductor medium on which is located a dielectric layer. The dielectric layer contains a piezoelectric film, and acoustic surface waves can be propagated along this structure. At opposite ends along the $z$ axis of the piezoelectric film are located acoustic wave transducers. Thereby, input acoustic surface wave signals are generated either for processing of, or for being processed by, stored information W. These input waves then propagate along the $\pm z$ axis in the piezoelectric film while the electric wave field associated with these acoustic waves mutually interact in the semiconductor medium, thereby nonlinearly mixing the acoustic waves and thereby generating sum and difference frequency electric fields. These electric fields excite charges on an output electrode(s) situated near, or in contact with, an exposed surface of the piezoelectric film. The electrode(s) integrates or sums the charge excited at each point along its length. Advantageously, a pattern of static electric charges is previously stored in the dielectric. The pattern of charge varies along the $z$ direction in accordance with a predetermined function $W(z)$, whereby the strength of nonlinear coupling of the pair of acoustic waves varies along the $z$ direction in the semiconductor medium in accordance with this pattern of electric charges stored in the dielectric. Accordingly, the sum of the output signal charges produced on the electrode(s) will constitute a representation of the desired convolution of the two input acoustic waves weighted by the stored pattern of static charges in the dielectric.

In a specific embodiment of the invention, an n-type conductivity silicon epitaxial layer on an $n^+$ semiconductor substrate body has a major surface on which has been grown a thin layer of silicon dioxide. The exposed surface of the silicon dioxide layer is itself coated with a sputtered layer of piezoelectric zinc oxide. The exposed surface of the piezoelectric is provided with an array of electrodes along the $z$ direction. Voltages with respect to the grounded semiconductor substrate are individually applied to each of the electrodes in accordance with a predetermined pattern corresponding to $W(z)$, for the purpose of injecting different controlled amounts of electrical charges from each of the electrodes into the piezoelectric zinc oxide layer. These charges are thereby trapped in the piezoelectric in the desired pattern along the length of the device and they accordingly modify the distribution of mobile electrical charges near the surface of the semiconductor contiguous to the silicon dioxide layer. More specifically, a suitable negative voltage applied to a given electrode will cause injection of negative charges which are trapped in the zinc oxide, and these trapped charges will increase the thickness of the depletion layer at the surface of the semiconductor locally beneath that electrode in accordance with the corresponding local value of $W(z)$ of the predetermined pattern. (In the absence of such trapped charges underneath a given electrode, the surface of the n-type silicon locally tends toward the condition of accumulation of majority charge carriers.) The applied voltages to the electrode array are removed, and a pair of input acoustic surface waves traveling in the $\pm z$ direction in the piezoelectric are excited by application of electronic RF signals to acoustic transducers situated at either end of the electrode array. One of these input waves is a continuous monochromatic acoustic wave of frequency $f$ and wavelength $\lambda$, while the other is a short pulse acoustic wave (of one or more wavelengths in duration) of the same frequency $f$ (and same wavelength $\lambda$) as the first wave. Thus, the first acoustic wave has a constant envelope, whereas the second wave has a pulse envelope. These acoustic waves produce corresponding electrical waves in the piezoelectric and the semiconductor, which waves will undergo nonlinear mixing in the semiconductor in the neighborhood of the surface where the depletion region varies in thickness corresponding to $W(z)$. Thereby, the strength of nonlinear mixing varies in accordance with $W(z)$ as a stored weighting function. By virtue of this mixing, a third (electrical) signal of frequency 2f is generated, which can be detected for example by means of an RF electrical detector one of whose terminals is connected to a ground plane on the underside of the semiconductor body and the other of whose terminals is connected in common through individual blocking capacitors to the electrodes. The third signal of frequency 2f will then be detected by the RF detector, and this third signal will have an envelope of the form W(vt), where $v$ is the acoustic wave velocity. Over a certain linear range, this envelope varies in time just as the pattern of voltages applied to the electrodes varied in position. In short, the output wave envelope represents a scanning of the pattern of voltages previously applied to the electrodes.

Moreover, different types of acoustic waves can be launched in the device, in order to provide different forms of signal processing purposes, that is, different functionals of the stored information $W(z)$. For example, the process of magnitude-signal correlation can be performed by using the same first input acoustic wave as above (constant envelope), but at the same time imposing upon the second input acoustic wave an envelope in accordance with the amplitude of a signal to be correlated with the stored weighting function W (which has again been stored as before by applying voltages to the electrodes as a voltage pattern). Another example is the generation of the fast Fourier transform of W, by means of the application of linear FM "chirped" waveforms to the acoustic input transducers. In other cases, the input acoustic waves can have differing frequencies (and hence different wavelengths), in conjunction with a comb-like spatially periodic output electrode array. By interleaving two pair of such arrays (spatially periodic interdigitated array), phase as well as amplitude information can be stored in the weighting function $W(z)$; thus, additional signal processing functionals, such as bi-phase correlation can be obtained in the practice of the invention.

BRIEF DESCRIPTION OF THE DRAWING

This invention, together with its features, objects and advantages, may be better understood from the following detailed description when read in conjunction with the drawing in which.

DETAILED DESCRIPTION

Figure 1:
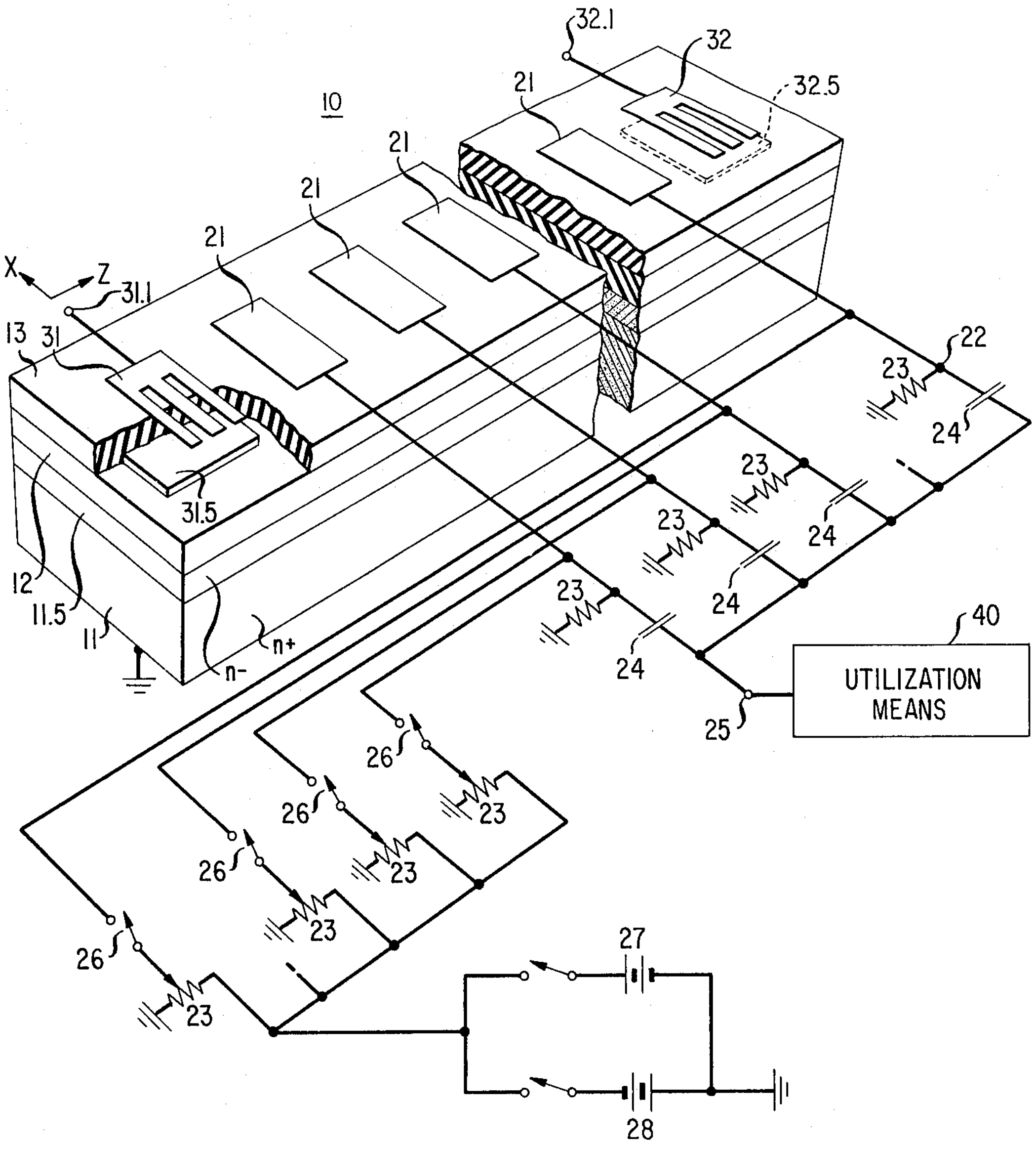
FIG. 1 is a perspective diagram, partly in cross section, of semiconductor apparatus for acoustic wave signal processing with a stored weighting function, in accordance with a specific embodiment of the invention.

As shown in FIG. 1, a weighted wave convolver 10 includes an about 1.75 micron thick piezoelectric zinc oxide layer 13, which has been dc sputtered at about 40° C, on an about 1,000-angstrom thick silicon dioxide layer 12. Advantageously, the thickness of the zinc oxide layer is about one-twentieth of the input acoustic wavelength, which for ultrasonic carrier frequencies of, for example, 130 MHz is about 32 microns and thus results in a zinc oxide layer thickness of about 1.6 micron. The silicon dioxide layer has been typically thermally grown on a 1-micron thick epitaxial layer 11.5 of n-type silicon. The epitaxial layer 11.5 has been epitaxially grown on a high conductivity monocrystalline n+ (of the order of 0.01 to 0.10 ohm-cm) silicon wafer substrate 11. Typically, the n-type epitaxial layer 11.5 contains a substantially uniform relatively low excess significant donor impurity concentration of about $10^{14}$ per $cm^3$. An array of electrodes 21, typically of aluminum having a thickness of 1,000 angstroms, is located on the top surface of the piezoelectric layer 13. Each electrode 21 has a length of the $x$ direction of about one millimeter, and is electrically accessed by a bonded lead to a terminal 22. These electrodes 21 are spaced apart typically by a few input acoustic wavelengths, typically about 200 microns and have widths in the $z$ direction of also about 200 microns. To each terminal 22 is connected in parallel a resistor 23 to ground, a blocking capacitor 24 to a common output terminal 25, and switches 26 which control the individually adjustable positive or negative voltage potential from batteries 27 or 28 to be supplied to each terminal 22 when the corresponding switch 26 is closed. Utilization means 40 is tuned to detect and utilize the electrical output signal at terminal 25. Input acoustic surface wave transducers 31 and 32 are located at opposite ends of the piezoelectric layer 13. Each transducer is controlled by an input terminal 31.1 or 32.1, respectively, and includes a ground plane 31.5 or 32.5, respectively, embedded at the interface of the piezoelectric layer 13 and the oxide layer 12 beneath the corresponding acoustic wave transducer. Typically, the transducers furnish acoustic waves of frequency 130 MHz, and are essentially aluminum fingers of a thickness of about 1,000 angstroms which are spaced apart to furnish a spatial periodicity of 32 microns, that is, the wavelength of the acoustic waves. Alternatively, as known in the art, each transducer electrode can be interdigitated with another similar electrode for application of electrical signal to be converted to acoustic waves. The ground planes 31.5 are typically essentially gold pads of a thickness of about 1,000 angstroms. Each of the capacitors 24 has a capacitance of typically about one hundred picofarads.

In operation, the device 10 operates as follows. First, the individual electrodes 21 are supplied with various voltages of negative polarity from the battery 28 with the switches 26 momentarily closed. Consequently, certain amounts of negative charges are stored in the piezoelectric layer 13 underneath the corresponding electrode, so that the piezoelectric layer is written in with a step-pattern of charge distribution which varies with $z$. In turn, the nonlinear (mixing) interaction of acoustic surface waves generated along the $\pm z$ direction by the transducers 31 and 32 varies in accordance with the previously written-in step-pattern of charges. Thus, the nonlinear mixing of these acoustic waves can be made to vary in accordance with any function $W(z)$. Erasure of these charges can be afforded by the application of sufficient positive voltage from the battery 27, typically at least about twice the magnitude of the voltage of the battery 28, in order to afford conveniently fast erase times of the same order as the write-in times.

The electrical output of the device 10 is taken through the capacitors 24 at the terminal 25 as the envelope of an RF electrical signal whose frequency is equal to the sum of the frequencies of the acoustic waves launched by the transducers 31 and 32. In this way, the envelope of the RF output at terminal 25 represents the weighted wave convolution of the acoustic waves with $W(z)$. Accordingly, the utilization means 40 should be tuned to receive electrical signals at the RF sum frequency.

In order to understand the operation of the device 10, if electronic signals with carrier frequencies $f_1$ and $f_2$ and envelopes F(t) and G(t) are applied to input transducers 31 and 32 spaced by a time delay T at time $t=0$, acoustic surface waves with envelopes $F(t-z/v)$ and $G(t+z/v-T)$ will be launched in the $\pm z$ directions respectively. The output voltage $V_{out}$, produced by the (nonlinear) acousto-electric mixing product of F and G, at terminal 25 feeding a utilization means 40, will be given by $$V_{out} = B\cos(2\pi f_3 t)\int_{l_1}^{l_2} dz W(z) F(t-z/v) G(t+z/v-T) \qquad (1)$$

where $f_3 = f_1 + f_2$, B is a constant determined from material parameters, $v$ is the acoustic surface wave velocity (approximately the same for $f_1$ and $f_2$), and the output electrode array begins at $z = l_1$ and continues to $z = l_2$. As can easily be shown from equation (1), if the input acoustic waves F and G are of the same frequency $f_1 = f_2 = f$, and if G is a continuous wave with constant envelope $G(t) = G_o$ while F is a narrow pulsed wave (envelope essentially an impulse $\delta$), $F(t) \approx F_o\,\delta(t)$, then the envelope of the output voltage $V_{out}(t)$ due to the (nonlinear) product mixing will be proportional to W(z); that is, $V_{out}$ will be a time-varying RF signal of frequency $f_3 = 2f$ whose envelope is a memory scan of the stored information $W(z)$, where $z$ ranges from $l_1$ to $l_2$:

$$V_{out}(t) \sim BF_oG_o\,W(vt). \qquad (2)$$

On the other hand, if the input acoustic wave G has an envelope which is some arbitrary function of $z/v + t - T$ as obtained by a corresponding electrical input $G(t)$ to the input transducer terminal 32.1, and if the input acoustic wave F has a constant envelope; then, with both F and G again of the same frequency $f_1 = f_2 = f$, the nonlinear mixing product output signal $V_{out}$ will be an RF signal of frequency $2f$ but with an envelope which is representative of the correlation of the envelope of G with the stored weighting function W (with $W = 0$ for all values of $z$ outside the interval $l_1 l_2$). That is to say, the envelope of RF output of frequency $2f$ at terminal 25 will be of a form representative of (magnitude-only) correlation:

$$V_{out}(t) \sim B\int_{l_1}^{l_2} dz\, W(z)\, G\left(\frac{z}{v} + t - T\right). \qquad (3)$$

If the roles of F and G are interchanged, then the convolution of F with W is obtained.

For Fourier transform processing, the input acoustic waves can be linear "chirps" of opposite sense, that is, acoustic wave F can be a wave excited by a signal to terminal 31.1 (FIG. 1) whose frequency varies as $(f_o + ct)$, with G as $(f_o - ct)$, where c is a constant, and both F and G have a constant envelope. The two chirps need not be in the same phase. In such a case, as known in the art, the (nonlinear) product has a constant frequency $f_3 = 2f_o$ has a time-varying propagation constant $k_3 = 2ct/v$, where again $v$ is the propagation velocity of the acoustic surface waves. Then the nonlinear acoustoelectric mixing produces an output representative in time of the Fourier transform of $W(z)$, with $W(z) = o$ outside the interval $l_1\ l_2$: namely, an RF output of frequency $2f_o$ with an envelope $V_{out}(t)$ given by:

$$V_{out}(t) \sim \int_{l_1}^{l_2} dz\, W(z)\exp(4\pi ict\, z/v); \qquad (4)$$

where $i$ is the imaginary root.

Figure 2:
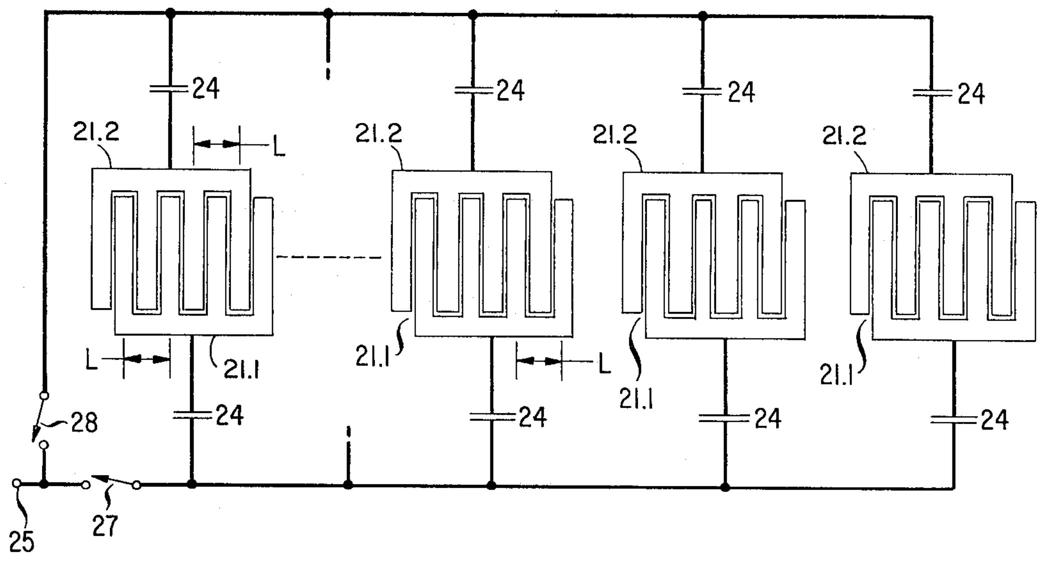
FIG. 2 is a diagram of an alternative electrode configuration for use in the apparatus shown in FIG. 1, in accordance with another specific embodiment of the invention.

Additional functional signal processes can be obtained in accordance with the invention, using input acoustic waves F and G of frequencies, $f_1$ and $f_2$, respectively, which are unequal. In such a case, the RF output will have a significant component at frequency $f_3 = f_1 + f_2$. However, in such a case, the wavelengths $\lambda_1$ and $\lambda_2$ of the acoustic waves in the piezoelectric will be different, as will be the propagation constants $k_1 = 2\pi/\lambda_1$ and $k_2 = 2\pi/\lambda_2$. The generated electric field pattern at frequency $f_3$ will have a spatial periodicity $\lambda_3 = 2\pi/k_3 = 2\pi/(k_1 - k_2)$. Accordingly, a comb-type set of electrodes 21.1 (FIG. 2) is advantageous, instead of the previous electrodes 21 (FIG. 1). The finger spatial period L of the electrode configuration advantageously is made equal to $\lambda_3$, in order to match the generated field pattern. An RF voltage of a particular phase is thus obtained between the grounded substrate and the comb-type set of electrodes 21.1. A second set of comb-type electrodes 21.2 is advantageously positioned a distance $z = \frac{1}{2}\lambda_3$ from the first set, so that the fingers of the second set of electrodes can be placed between those of the first set of electrodes 21.1, and so that an output of RF voltage obtained on 21.2 is of the opposite phase to that on 21.1. For write-in storage of the weighting function $W(z)$, voltage pulses are momentarily applied to the different electrodes, similarly as in the case of FIG. 1 by means similar thereto (not shown). Ordinarily, the write-in voltages are applied to only one set of electrodes, either 21.1 or 21.2, for the entire length of the array so that output fields are generated only beneath one set, and the voltages so generated are all in phase. For "bi-phase" operation of the device, a write-in voltage is again only applied to one electrode (either 21.1 or 21.2) of a particular pair, but the choice of 21.1 or 21.2 from point-to-point along the array is chosen according to the predetermined phase of $W(z)$. Thus, at each position along the array, information stored, $W(z)$, can have either a plus or minus relative phase, as well as magnitude.

This latter approach is useful in some applications, particularly bi-phase correlation and others involving transformations with phase information. Here (FIG. 2), only $\pm$ relative phase information is obtainable, but finer phase information is obtainable by having more than two electrode fingers per spatial period $L = 2\pi/k_3$, and then using for write-in only one electrode per spatial period, that is, that particular electrode situated at the desired corresponding phase position.

In other applications of the invention, differing write-in voltages can be applied to each electrode of a pair, thereby furnishing a difference output signal representative of the effective incremental difference in RF output produced by these write-in voltages to each pair of electrodes.

Figure 3:
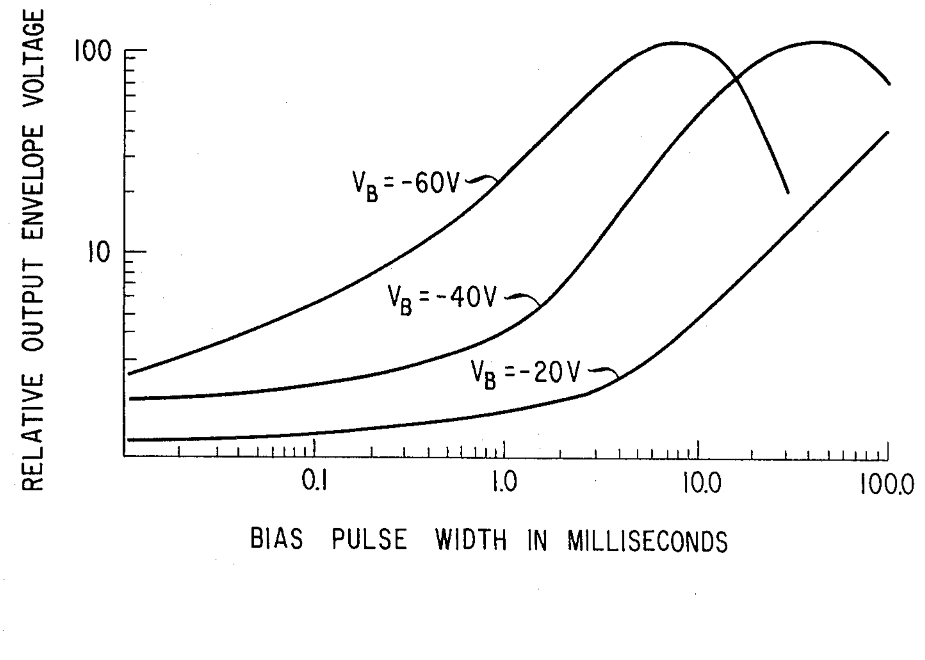
FIG. 3 is a plot of the output of relative RF output voltage envelopes vs. write-in pulse width, for different storage bias pulse heights, in the apparatus shown in FIG. 1.

In the operation of the above-described device shown in FIG. 1, typical output level changes following a write-in pulse are illustrated in FIG. 3. The ordinate of the curves is the ratio of the output voltage envelope $V_{out}$ to its equilibrium (no write-in) value at RF frequency $f_3 = f_1 + f_2 = 2f_1$ (the "degenerate case" $f_1 = f_2$). The abscissa is the pulse width time, i.e., the time interval during which the corresponding switch 26 is closed, thereby applying the (negative) bias write-in voltage $V_B$ from the battery 28 through a corresponding potentiometer 23. Prior to the application of this write-in pulse, all previously stored charge is removed by an erasing pulse of opposite polarity. For differing voltage heights $V_B$, differing responses $V_{out}$ are obtained, thereby showing that different charges are injected into the piezoelectric by different $V_B$ pulse heights. Likewise, for the same pulse height $V_B$, different RF responses $V_{out}$ are obtained for different charging time intervals (pulse widths).

For linearity of the change in weighting function $W(z)$ and hence for linearity of the relative RF output $V_{out}$, as a function of charging pulse time with a fixed pulse height $V_B$, the portion of the curve in FIG. 3 corresponding to such $V_B$ in the vicinity of the point of inflection (the straight line portion) should be used. That is, all the charging times used for a given $V_B$ should advantageously be sufficiently within the neighborhood of the inflection point as to keep within the straight line portion of the corresponding curve. However, this invention can be practiced outside the linear portion, particularly in digital information applications.

It should be stressed that as time passes subsequent to the charging intervals, the curves in FIG. 3 tend to drift due to a natural discharge phenomenon. Therefore, in order to determine the absolute shift in RF response level (as per FIG. 3), output measurements should be taken within a few minutes after the bias pulse charging interval, to avoid errors due to discharge. However, the amount of charge stored at a particular position relative to other positions can be measured as long as several hours after write-in. These storage times can be increased by using a more stable trapping mechanism than storage directly in the piezoelectric, such as an auxiliary trapping layer or suitable trapping levels artifically introduced into the piezoelectric. Tunnelling phenomena from the semiconductor to the oxide piezoelectric interface, instead of from the electrode 21 into the piezoelectric, may be helpful to achieve a higher degree of nonvolatility of charge storage in the dielectric. To date it has been found that piezoelectric zinc oxide with an aluminum electrode 21 material is preferred for stable (over 10 minutes) injection of charge into the piezoelectric, where the zinc oxide has been sputtered at between about 38° C and 42° C (substrate temperature) onto the silicon dioxide layer 12.

Figure 4:
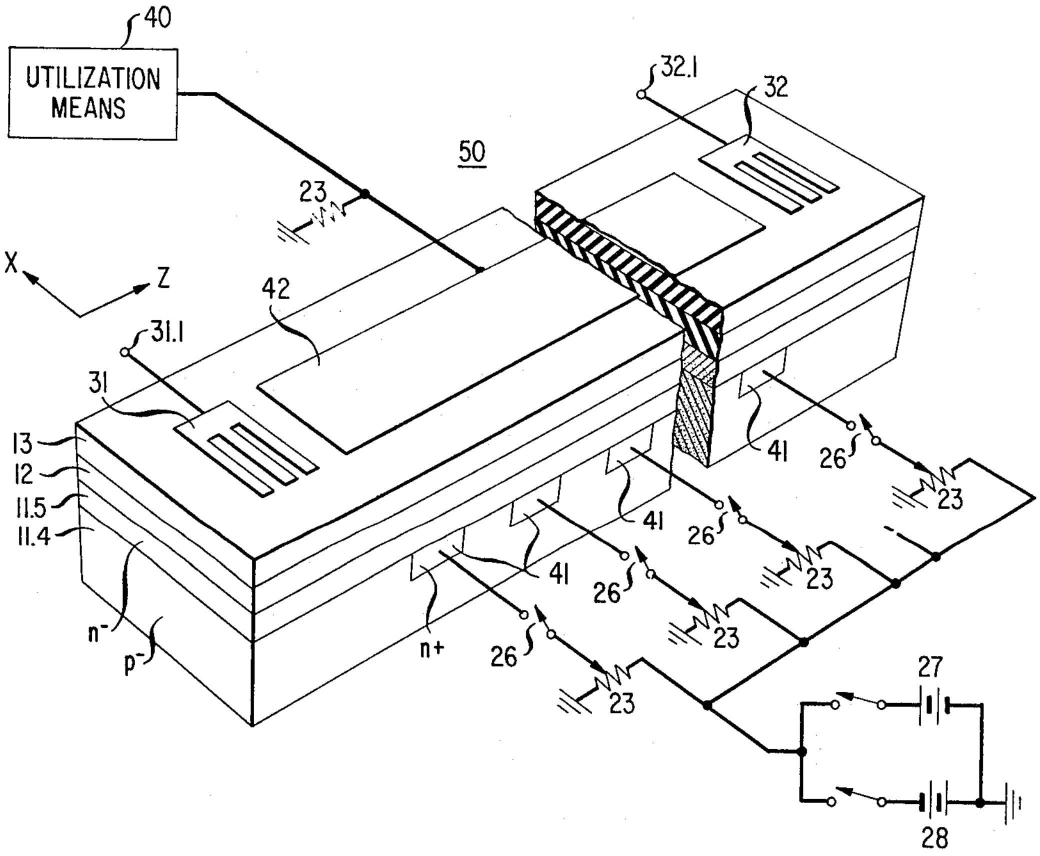
FIG. 4 is a perspective diagram, partly in cross section, of semiconductor apparatus for acoustic wave signal processing with a stored weighting function, in accordance with another specific embodiment of the invention.

FIG. 4 illustrates an alternative device 50 which is similar to the device 10 except that the previous individual electrodes 21 used for RF output as well as write-in biasing are now replaced by "buried layer" biasing electrode stripes 41 together with a single continuous plate electrode 42 for output detection. Identical elements in FIGS. 1 and 4 are labelled with the same reference numerals. This configuration of FIG. 4 separates the write-in and readout circuits, greatly simplifying the latter. By using additional parallel acoustic paths with a single buried layer biasing array matrix addressing techniques known in the art are obtainable.

The configuration of FIG. 4 also permits nondegenerate $(f_1 \quad f_2)$ operation of the device with a continuous output electrode 42, if the period of the buried layer conductors 41 in equal to $\lambda = 2\pi/(k_1 - k_2)$, or an integer submultiple thereof for multiphase operation. This type of operation is made possible by the fact that essentially no RF output fields are generated in the regions between the biasing conductors 41 where no charge is stored. Thus, only inphase output fields are applied to the output electrode 42. The "buried layer" stripes 41 are of $n^+$ type conductivity silicon semiconductor, typically 10,000 angstroms thick diffused regions embedded in a substrate 11.4 of $p^-$-type conductivity. Here, the superscript of $p^-$ represents relatively high electrical resistivity (low conductivity) $p^-$-type silicon, of the order of 100 to 1,000 ohm-cm, whereas the superscript on $n^+$ represents relatively high conductivity n-type silicon, of the order of 0.01 to 0.10 ohm-cm (as in FIG. 1).

While the invention has been described in terms of specific embodiments, various modifications can be made without departing from the scope of the invention. For example, the illustrative embodiment utilized zinc oxide as the piezoelectric and silicon as the semiconductor; however, under suitable conditions other piezoelectrics and semiconductors may be useful in the practice of the invention.

What is claimed is:

1. Apparatus which comprises:

a. a body of semiconductor having a major surface upon which is disposed a layer of dielectric, said dielectric layer including at least one piezoelectric film, such that an acoustic wave propagating along the film undergoes nonlinear acoustoelectric interaction with the semiconductor;

b. first electrode array means for producing in the dielectric layer a pattern of stored electrical charges which varies in a first direction;

c. second means for launching a pair of acoustic waves propagating along the surface, one of the waves propagating in the first direction and the other of the waves propagating in the opposite direction, said waves mutually interacting with the semiconductor, whereby an electrical response is generated by the semiconductor which as a function of time is a functional representation of the pattern depending upon the acoustic waves.

2. Apparatus according to claim 1 wherein said first means includes circuit means for enabling the application of voltages to the electrodes whereby electrical charges are injected into the piezoelectric film in accordance with the pattern sufficient to modify the mutual interaction of the acoustic waves with the semiconductor according to the pattern.

3. Apparatus according to claim 1 in which the first means comprises an array of buried layer semiconductor electrode stripes of relatively high electrical conductivity in the semiconductor body.

4. Apparatus according to claim 1 in which the piezoelectric film is zinc oxide which has been depositted by being sputtered at about 40° C substrate temperature.

5. Apparatus according to claim 1 which further includes electrode means situated contiguous to the dielectric layer for detecting the electrical response.

6. Apparatus which comprises:

a. a body of semiconductor having a major surface coated by a dielectric layer which is coated with a piezoelectric layer, the thickness of the dielectric being such that an acoustic wave propagating along the surface undergoes nonlinear acoustoelectric interaction with the semiconductor;

b. an array of electrodes for producing in the piezoelectric layer a pattern of stored electrical charges which varies in a first direction in response to a corresponding pattern of voltages applied to the electrodes;

c. means for launching a pair of acoustic waves in the film, one of the waves propagating in the first direction and the other of the waves propagating in the opposite direction, said waves mutually interacting with the semiconductor, whereby an electrical response is generated by the semiconductor which as a function of time is a functional representation of the pattern depending upon the envelopes and frequencies of the acoustic waves.

7. Apparatus according to claim 6 in which the electrodes are essentially buried layer semiconductor stripes in the body, said stripes being of relatively high conductivity compared to the bulk of the semiconductor body.

8. Apparatus according to claim 6 in which the electrodes are essentially metallic stripes on the exposed major surface of the piezoelectric layer.

9. Apparatus according to claim 8 in which the piezoelectric layer is essentially zinc oxide.

10. Apparatus according to claim 6 in which the piezoelectric layer is essentially zinc oxide, the dielectric layer is essentially silicon dioxide, and the body is essentially silicon.

11. Apparatus according to claim 6 in which the piezoelectric film is zinc oxide which has been deposited by sputtering at about 40° C substrate temperature.

* * * * *

UNITED STATES PATENT AND TRADEMARK OFFICE

CERTIFICATE OF CORRECTION

PATENT NO. : 3,982,113

DATED : September 21, 1976

INVENTOR(S) : Larry A. Coldren

It is certified that error appears in the above-identified patent and that said Letters Patent are hereby corrected as shown below:

Column 4, line 23, "of", first occurrence, should be --in--; Column 5, line 30, that portion of the formula reading $$\begin{matrix}\ell_2\\ \ell_1\end{matrix} \quad \text{should read} \quad \int_{\ell_1}^{\ell_2}$$

line 49, insert parenthesis before "z/v"; line 50, insert parenthesis after "T"; line 65, that portion of the formula reading $$\begin{matrix}\ell_2\\ \ell_1\end{matrix} \quad \text{should read} \quad \int_{\ell_1}^{\ell_2}$$

line 65, that portion of the formula reading "$\frac{z}{v} + t - T$" should read --($\frac{z}{v} + t - T$)--. Column 6, line 9, "has" should be changed to --and--; line 20, that portion of the formula reading $$\begin{matrix}\ell_2\\ \ell_1\end{matrix} \quad \text{should read} \quad \int_{\ell_1}^{\ell_2}$$

Column 8, line 9, after "$f_1$" insert -- $\neq$ --; line 21, "of" should be --on--.

Signed and Sealed this

Twenty-fifth Day of January 1977

[SEAL]

*Attest:*

RUTH C. MASON
*Attesting Officer*

C. MARSHALL DANN
*Commissioner of Patents and Trademarks*